United States Patent
Maleki et al.

(10) Patent No.: US 7,634,201 B2
(45) Date of Patent: Dec. 15, 2009

(54) WIDEBAND RECEIVER BASED ON PHOTONICS TECHNOLOGY

(75) Inventors: Lutfollah Maleki, Pasadena, CA (US); Danny Eliyahu, Pasadena, CA (US); David Seidel, Alta Loma, CA (US)

(73) Assignee: OEwaves, Inc., Pasadena, CA (US)

(*) Notice: Subject to any disclaimer, the term of this patent is extended or adjusted under 35 U.S.C. 154(b) by 0 days.

(21) Appl. No.: 11/849,279

(22) Filed: Sep. 1, 2007

(65) Prior Publication Data

US 2008/0075464 A1    Mar. 27, 2008

Related U.S. Application Data

(60) Provisional application No. 60/842,008, filed on Sep. 1, 2006.

(51) Int. Cl.
*H04B 10/06*    (2006.01)

(52) U.S. Cl. .................. 398/202; 398/115; 398/116; 398/118; 398/163; 398/164; 398/203; 398/204; 385/88; 385/89; 385/92; 385/93; 372/32; 372/29.01; 372/18; 372/20; 356/541; 356/484

(58) Field of Classification Search .......... 398/115, 398/82, 182, 183, 79, 90, 91, 93, 95, 154, 398/155, 162, 163, 192, 193, 194, 195, 196, 398/118, 116, 202, 203, 204, 206, 207, 208, 398/209, 212, 213, 214, 128, 130, 135, 164; 385/8, 9, 15, 27, 31, 14, 2, 3, 4, 5, 88, 89, 385/90, 92, 93; 372/28, 29.01, 32, 18, 20; 356/541, 484
See application file for complete search history.

(56) References Cited

U.S. PATENT DOCUMENTS

| | | | |
|---|---|---|---|
| 5,204,640 A | 4/1993 | Logan, Jr. | |
| 5,220,292 A | 6/1993 | Bianchini et al. | |
| 5,710,651 A | * 1/1998 | Logan, Jr. ............ | 398/168 |
| 5,723,856 A | 3/1998 | Yao et al. | |
| 5,751,747 A | 5/1998 | Lutes et al. | |
| 5,777,778 A | 7/1998 | Yao | |
| 5,917,179 A | 6/1999 | Yao | |
| 5,929,430 A | 7/1999 | Yao et al. | |
| 5,985,166 A | 11/1999 | Unger et al. | |

(Continued)

FOREIGN PATENT DOCUMENTS

WO    01/96936    12/2001

(Continued)

OTHER PUBLICATIONS

Braginsky, et al., "Quality-Factor and Nonlinear Properties or Optical Whispering-Gallery Modes", Physics Letters A, vol. 137, Nos. 7, 8, pp. 393-397, May 29, 1989.

(Continued)

*Primary Examiner*—Hanh Phan
(74) *Attorney, Agent, or Firm*—Fish & Richardson P.C.

(57) ABSTRACT

Tunable receivers and techniques for receiving an electrical oscillator signal in the RF, microwave or millimeter spectral range based on photonics technology to use both (1) photonic or optical components and (2) electronic circuit components.

25 Claims, 10 Drawing Sheets

U.S. PATENT DOCUMENTS

| | | | |
|---|---|---|---|
| 6,080,586 A | 6/2000 | Baldeschwieler et al. | |
| 6,178,036 B1 | 1/2001 | Yao | |
| 6,203,660 B1 | 3/2001 | Unger et al. | |
| 6,389,197 B1 | 5/2002 | Iltchenko et al. | |
| 6,417,957 B1 | 7/2002 | Yao | |
| 6,459,519 B1* | 10/2002 | Sasai et al. | 398/183 |
| 6,473,218 B1 | 10/2002 | Maleki et al. | |
| 6,476,959 B2 | 11/2002 | Yao | |
| 6,487,233 B2 | 11/2002 | Maleki et al. | |
| 6,488,861 B2 | 12/2002 | Iltchenko et al. | |
| 6,490,039 B2 | 12/2002 | Maleki et al. | |
| 6,535,328 B2 | 3/2003 | Yao | |
| 6,567,436 B1 | 5/2003 | Yao et al. | |
| 6,580,532 B1 | 6/2003 | Yao et al. | |
| 6,594,061 B2 | 7/2003 | Huang et al. | |
| 6,643,417 B2* | 11/2003 | Strutz et al. | 385/1 |
| 6,762,869 B2 | 7/2004 | Maleki et al. | |
| 6,795,481 B2 | 9/2004 | Maleki et al. | |
| 6,798,947 B2 | 9/2004 | Iltchenko | |
| 6,853,479 B1 | 2/2005 | Ilchenko et al. | |
| 6,871,025 B2 | 3/2005 | Maleki et al. | |
| 6,873,631 B2 | 3/2005 | Yao et al. | |
| 6,879,752 B1 | 4/2005 | Ilchenko et al. | |
| 6,901,189 B1 | 5/2005 | Savchenkov et al. | |
| 6,906,309 B2 | 6/2005 | Sayyah et al. | |
| 6,922,497 B1 | 7/2005 | Savchenkov et al. | |
| 6,928,091 B1 | 8/2005 | Maleki et al. | |
| 6,943,934 B1 | 9/2005 | Ilchenko et al. | |
| 6,987,914 B2 | 1/2006 | Savchenkov et al. | |
| 7,024,069 B2 | 4/2006 | Savchenkov et al. | |
| 7,043,117 B2 | 5/2006 | Matsko et al. | |
| 7,050,212 B2 | 5/2006 | Matsko et al. | |
| 7,061,335 B2 | 6/2006 | Maleki et al. | |
| 7,062,131 B2 | 6/2006 | Ilchenko | |
| 7,092,591 B2 | 8/2006 | Savchenkov et al. | |
| 7,133,180 B2 | 11/2006 | Ilchenko et al. | |
| 7,173,749 B2 | 2/2007 | Maleki et al. | |
| 7,184,451 B2 | 2/2007 | Ilchenko et al. | |
| 7,187,870 B2 | 3/2007 | Ilchenko et al. | |
| 7,218,662 B1 | 5/2007 | Ilchenko et al. | |
| 7,248,763 B1 | 7/2007 | Kossakovski et al. | |
| 7,260,279 B2 | 8/2007 | Gunn et al. | |
| 7,283,707 B1 | 10/2007 | Maleki et al. | |
| 7,369,722 B2 | 5/2008 | Yilmaz et al. | |
| 7,379,672 B2* | 5/2008 | Wang et al. | 398/115 |
| 7,389,053 B1 | 6/2008 | Ilchenko et al. | |
| 7,400,796 B1 | 7/2008 | Kossakovski et al. | |
| 7,440,651 B1 | 10/2008 | Savchenkov et al. | |
| 7,460,746 B2 | 12/2008 | Maleki et al. | |
| 2001/0038651 A1 | 11/2001 | Maleki et al. | |
| 2002/0018611 A1 | 2/2002 | Maleki et al. | |
| 2002/0018617 A1 | 2/2002 | Iltchenko et al. | |
| 2002/0021765 A1 | 2/2002 | Maleki et al. | |
| 2002/0081055 A1 | 6/2002 | Painter et al. | |
| 2002/0085266 A1 | 7/2002 | Yao | |
| 2002/0097401 A1 | 7/2002 | Maleki et al. | |
| 2003/0160148 A1 | 8/2003 | Yao et al. | |
| 2004/0100675 A1 | 5/2004 | Matsko et al. | |
| 2004/0109217 A1 | 6/2004 | Maleki et al. | |
| 2004/0218880 A1 | 11/2004 | Matsko et al. | |
| 2004/0240781 A1 | 12/2004 | Savchenkov et al. | |
| 2005/0017816 A1 | 1/2005 | Ilchenko et al. | |
| 2005/0063034 A1 | 3/2005 | Maleki et al. | |
| 2005/0074200 A1 | 4/2005 | Savchenkov et al. | |
| 2005/0123306 A1 | 6/2005 | Ilchenko et al. | |
| 2005/0128566 A1 | 6/2005 | Savchenkov et al. | |
| 2005/0175358 A1 | 8/2005 | Ilchenko et al. | |
| 2005/0248823 A1 | 11/2005 | Maleki et al. | |
| 2007/0009205 A1 | 1/2007 | Maleki et al. | |
| 2007/0153289 A1 | 7/2007 | Yilmaz et al. | |
| 2007/0292142 A1* | 12/2007 | Hashimoto et al. | 398/186 |
| 2008/0001062 A1 | 1/2008 | Gunn et al. | |
| 2008/0310463 A1 | 12/2008 | Maleki et al. | |

FOREIGN PATENT DOCUMENTS

| | | |
|---|---|---|
| WO | 2005/038513 | 4/2005 |
| WO | 2005/055412 | 6/2005 |
| WO | 2005/067690 | 7/2005 |
| WO | 2005/122346 | 12/2005 |
| WO | 2006/076585 | 7/2006 |
| WO | 2007/143627 | 12/2007 |

OTHER PUBLICATIONS

Eliyahu, D. and L. Maleki, "Modulation Response (S21) of the Coupled Opto-Electronic Oscillator," Proceedings of the 2005 IEE Freq. Control Symposium, pp. 850-856, Aug. 2005.

Eliyahu, D. and L. Maleki, "Tunable, ultra-low phase noise YIG based opto-electronic oscillator," Microwave Symposium Digest, 2003 IEEE MTT-S International 3: 2185-2187 (Jun. 2003).

Eliyahu, D., and L. Maleki, "Low phase noise and spurious levels in multi-loop opto-electronic oscillators," Proc. 2003 IEEE International Frequency Control Sympsoium, pp. 405-410 (tamps, FL; Apr. 2003).

Gorodetsky et al., "Optical microsphere resonators: optimal coupling to high-Q whispering-gallery modes," J.Opt. Soc. Am. B. vol. 16, No. 1, pp. 147-154 (Jan. 1999).

Gorodetsky et al., "Ultimate Q of optical microsphere resonators," Optics Letters 21(7): 453-455 (Apr. 1, 1996).

Gorodetsky, et al., "Rayleigh scattering in high-Q microspheres", J. Opt. Soc. Am. B, vol. 17, No. 6, pp. 1051-1057, Jun. 2000.

Hryniewicz, et al., "Higher Order Filter Response in Coupled Microring Resonators", IEEE Photonics Technology Letters, vol. 12, No. 3, pp. 320-323, Mar. 2000.

Huang, S. et al., "A 'turnkey' opto-electronic oscillator with low acceleration sensitivity," 2000 IEEE/EIA International Frequency Control Symposium and Exhibition, p. 269-279 (O-7803-5834-4).

Ilchenko et al., "Microsphere integration in active and passive photonics devices," Kudryashov, et al.. (Eds.) Laser Resonators III, Proceedings of SPIE, vol. 3930, pp. 154-162, San Jose, California, Jan. 26-28, 2000.

Ilchenko, et al., "Whispering-gallery-mode electro-optic modulator and photonic microwave receiver", J. Opt. Soc. Am. B., vol. 20, No. 2, pp. 333-342, Feb. 2003.

Ilchenko et al., "Electrooptically Tunable Photonic Microresonators and Photonic Bandgap Waveguide Coupling for Micro-Optoelectronic Oscillators," GOMACTech 2003, Tampa, Florida, pp. 1-4.

Ilchenko et al., "High-Q microsphere cavity for laser stabilization and optoelectronic microwave oscillator," Proceedings SPIE, vol. 3611, p. 190-198 (1999).

Ilchenko et al., "Microtorus: a high-finesse microcavity with whispering-gallery modes," Optics Letters, vol. 26, No. 5, pp. 256-258 (Mar. 2001).

Ilchenko et al., "Pigtailing the high-Q microsphere cavity: a simple fiber coupler for optical whispering-gallery modes," Optics Letters, vol. 24, No. 11, pp. 723-725 (Jun. 1, 1999).

Ilchenko, et al., "Tunability and synthetic lineshapes in high-Q optical whispering gallery modes", Proc. Of SPIE, vol. 4969, pp. 195-206, 2003.

Ilchenko, V., et al., "Sub-Micro Watt Photonic Microwave Receiver", *IEEE Photonics Technology Letters*, 14(11):1602-1604, Nov. 2002.

Ito, H., et al., "InP/InGaAs Uni-Travelling-Carrier Photodiode with 310 GHz Bandwidth", *Electronics Letters*, 36(21):1809-1810, Oct. 2000.

Logan, et al., "Stabilization of Oscillator Phase Using a Fiber-Optic Delay-Line", *IEEE 45th Annual Symposium on Frequency Control*, pp. 508-512 (1991).

Maleki, L., "The Opto-Electronic Oscillator: Prospects for Extending the State-of-the-Art in Reference Frequency Generation," in International Topical Meeting on Microwave Photonics Conference, Oct. 12-14, 1998, Princeton, New Jersey.

Matsko, et al., "Active mode locking with whispering-gallery modes", J. Opt. Soc. Am. B., vol. 20, No. 11, pp. 2292-2296, Nov. 2003.

Matsko, et al., "Whispering gallery mode based optoelectronic microwave oscillator", Journal of Modern Optics, vol. 50, No. 15-17, pp. 2523-2542, 2003.

Myers, L.E., et al., "Quasi-Phase-Matched Optical Parametric Oscillators in Bulk Periodically Poled $LiNbO_3$", *J. Opt. Soc. Am. B*, 12(11):2102-2116, Nov. 1995.

Vassiliev, et al., "Narrow-line-width diode laser with a high-Q microsphere resonator", Optics Communications, vol. 158, pp. 305-312, Dec. 15, 1998.

Yao et al., "Coupled Optoelectronic Oscillators for Generating Both RF Signal and Optical Pulses," Journal of Lightwave Tecnhology, vol. 18, No. 1, pp. 73-78 (Jan. 2000).

Yao et al., "Dual microwave and optical oscillator," Optics Letters, vol. 22, No. 24, pp. 1867-1869 (Dec. 15, 1997).

Yao et al., "Multiloop Optoelectronic Oscillator," IEEE Journal of Quantum Electronics, vol. 36, No. 1, pp. 79-84, (Jan. 2000).

Yao et al., "Optoelectronic Oscillator for Photonic Systems," IEEE Journal of Quantum Electronics, vol. 32, No. 7, pp. 1141-1149 (Jul. 1996).

Yao, X. Steve, et al., "Converting Light into Spectrally Pure Microwave Oscillation", *Optics Letters*, 21(7):483-485, Apr. 1996.

Yao, X.S. and L. Maleki et al., "Optoelectronic microwave oscillator," J. Opt. Soc. Am. B. ,vol. 13, No. 8, pp. 1725-1735 (Aug. 1996).

Yao, X.S. And L. Maleki., "A Novel Photonic Oscillator," TDA Progress Report 42-122, pp. 32-43 (Aug. 15, 1995).

Yao, et al., "A Novel Photonic Oscillator", IEEE/LEOS 1995 Summer Topical Meetings, Keystone, Colorado, Aug. 9-11, 1995, pp. 17-18.

Yu et al., "Compact optoelectronic oscillator with ultra-low phase noise performance," Electronics Letters, vol. 35, No. 18, pp. 1554-1555 (1999).

Matsko, A., et al., "Whispering-Gallery-Mode Resonators as Frequency References. I. Fundamental Limitations," *J. Opt. Soc. Am. B*, 24(6):1324-1335, Jun. 2007.

Savchenkov, A., et al., "Whispering-Gallery-Mode Resonators as Frequency References. II. Stabilization," *J. Opt. Soc. Am. B*, 24(12): 2988-2997, Dec. 2007.

International Search Report and Written Opinion dated Jun. 17, 2008 for International Application No. PCT/US2007/077476, filed Sep. 1, 2007 (7 pages).

International Preliminary Report on Patentability dated Mar. 10, 2009 for International Application No. PCT/US2007/077476, filed Sep. 1, 2007 (5 pages).

\* cited by examiner

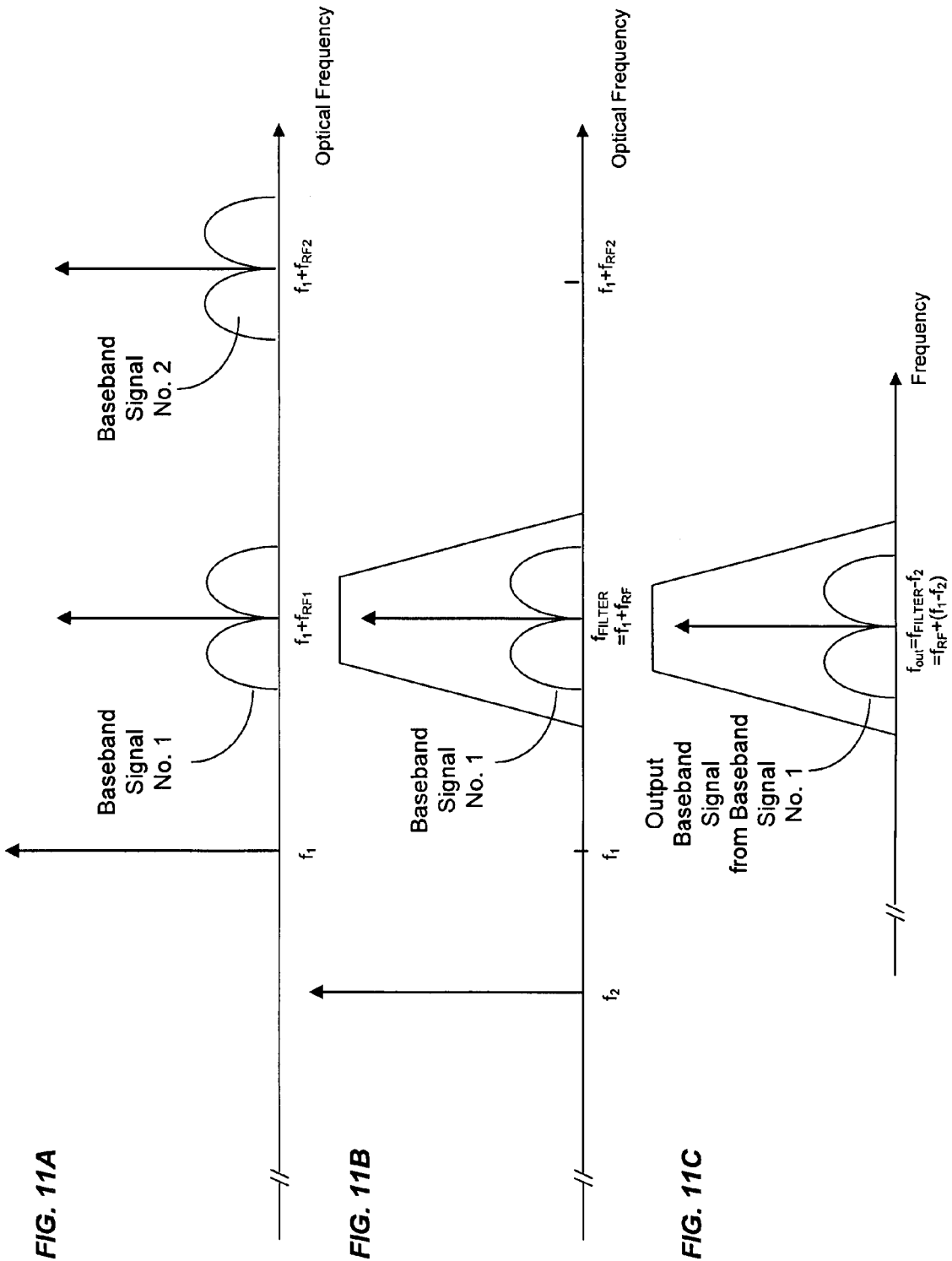

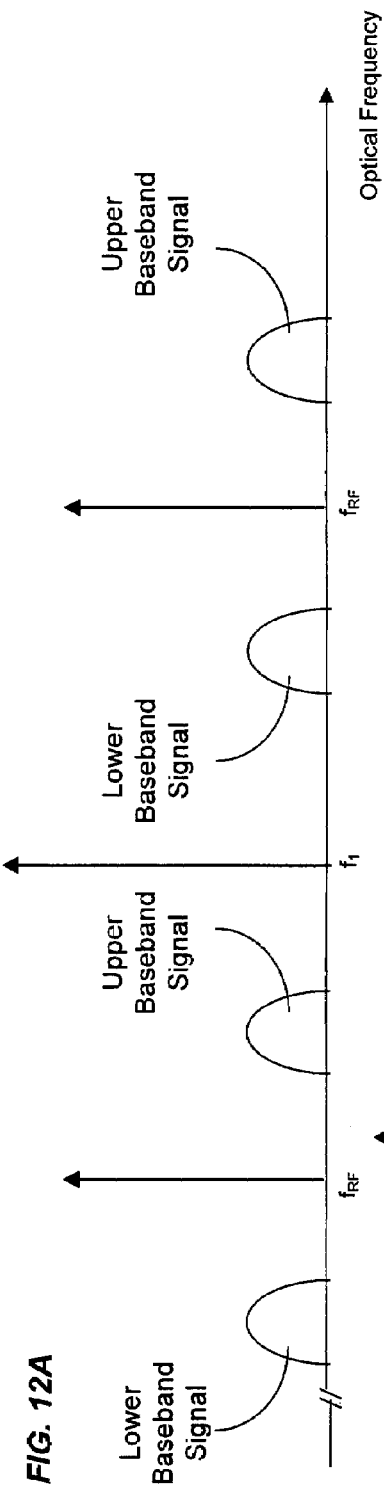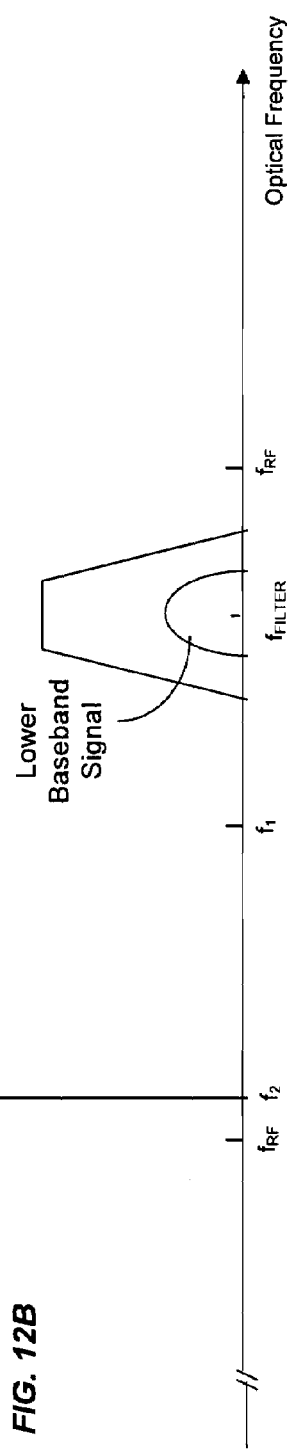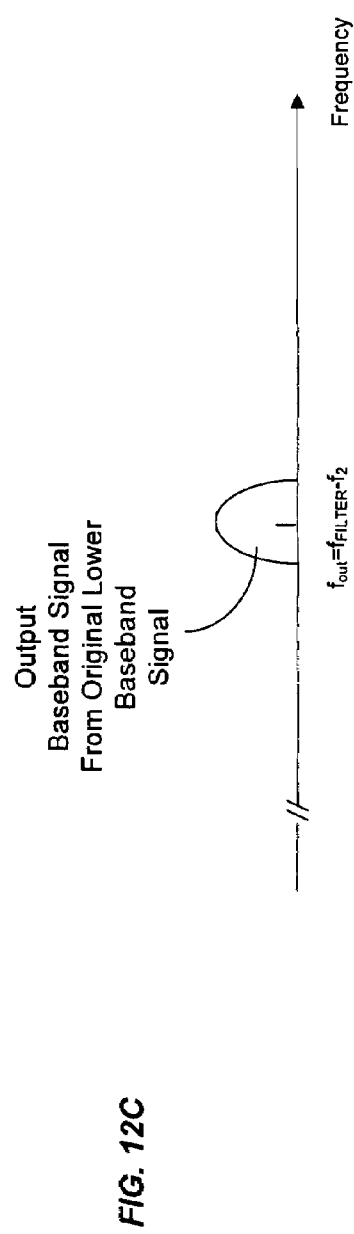

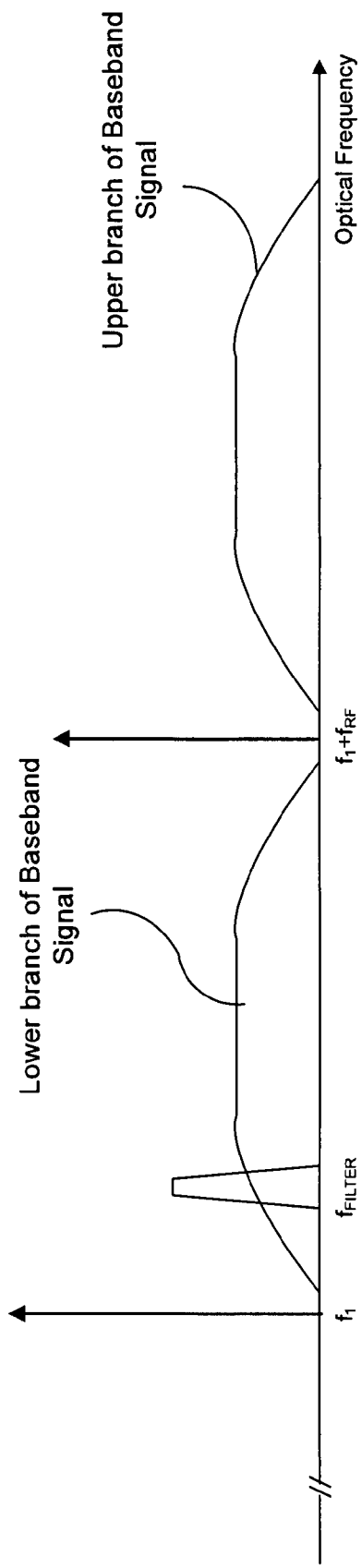
FIG. 13A
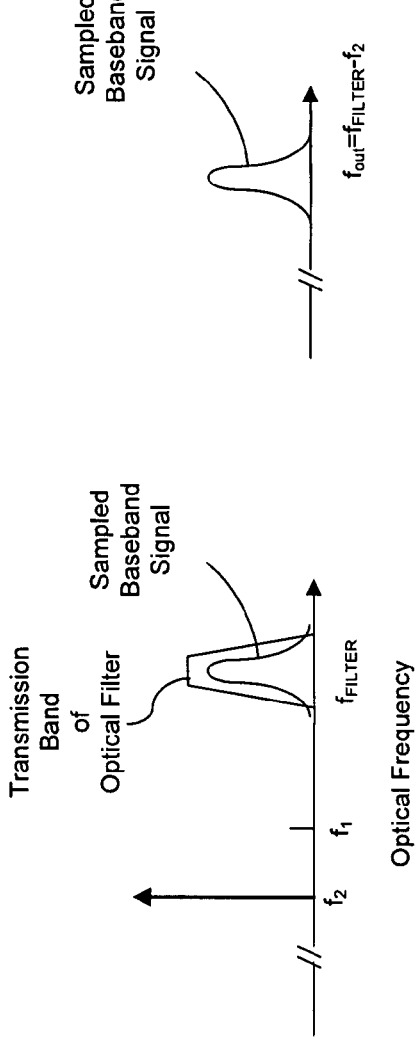
FIG. 13B
FIG. 13C

WIDEBAND RECEIVER BASED ON PHOTONICS TECHNOLOGY

This application claims the benefit of U.S. Provisional Patent Application No. 60/842,008 entitled "Wideband Receiver Based on Photonics Technology" and filed on Sep. 1, 2006, which is incorporated herein by reference as part of the specification of this application.

BACKGROUND

This application relates to electronic devices and photonic devices for handling oscillation signals in a radio frequency (RF), microwave or millimeter wave spectral range.

A baseband signal can be carried by a radio frequency (RF) carrier signal to transmit either (1) wirelessly via air or (2) through a cable or waveguide from an RF signal transmitter or generator to an RF signal receiver. In many RF systems, the RF signal receiver can be designed to filter the received RF signal and to mix the filtered RF signal with an RF local oscillator (LO) signal generated by an RF local oscillator to convert the RF signal at the RF carrier frequency to an intermediate frequency (IF) at a lower frequency. The down-converted IF signal is then processed to extract the baseband signal for various signal processing operations.

In various RF applications, the RF receiver can be a tunable wideband RF receiver to tune to a range of RF frequencies. Such a wideband RF receiver can be realized using a bank of tunable RF filters to filter the received RF signal to select an RF frequency of interest from the detected input signal of an RF input port or circuit which can be, for example, a wideband RF antenna. A tunable synthesizer can be provided to mix the filtered RF signal output by the bank of tunable RF filters with the RF LO signal to down-convert the RF signal to IF. This approach requires many RF circuit elements, including the bank of filters, synthesizers, mixers, and various stages of signal amplification and thus the wideband receiver can have complex receiver circuitry and suffer losses at various stages in the circuitry. In addition, the frequency tuning range of such RF wideband receivers can be limited and narrow bandwidths can be difficult to achieve in the RF range using RF electronic filter designs.

SUMMARY

This application describes, among others, tunable wideband receivers in the RF, microwave or millimeter spectral range based on photonics technology to use both (1) photonic or optical components and (2) electronic circuit components. Such photonics-based tunable wideband receivers are designed to have electronic input and output interfaces like an all-electronic wideband RF receiver but have an internal photonic module to provide signal processing in the optical domain using the photonic or optical components. For example, in one implementation of a photonics-based wideband receiver, one part of signal processing is performed in the RF, microwave or millimeter domain and another part of the processing is performed in the optical domain. Optical filtering can be performed to select a desired signal component in the received RF, microwave or millimeter signal and tuning of the receiver frequency can also be performed in the optical domain. Signal frequency conversion such as the RF to IF down conversion can also be achieved via optical processing. Such optical processing can be advantageous over electronic processing and can be used to achieve receiver functions or characteristics that may be difficult to achieve using some all-electronic RF, microwave or millimeter wave receivers.

In one aspect, a device is described to include a first laser to produce a first continuous-wave (CW) laser beam at a first laser frequency; an optical modulator to receive the first CW laser beam and the input signal and operable to modulate the first CW laser beam in response to an electrical oscillation signal to produce a modulated optical beam that carries the electrical oscillation signal; a tunable optical filter to filter the modulated optical beam from the optical modulator to select at least one spectral component in the modulated optical signal while rejecting other spectral components and to output a filtered modulated optical beam that carries the at least one selected spectral component; a filter control unit to tune a center frequency of the tunable optical filter to tune the at least one selected spectral component; a second laser to produce a second CW laser beam at a second laser frequency; an optical detector to receive both the filtered modulated optical beam from the tunable optical filter and the second CW laser beam to produce a receiver output signal at an output frequency; and a control unit to lock the first and second lasers in phase relative to each other and to control the first and the second lasers to tune a difference between the first and the second laser frequencies in response to the tuning of the center frequency of the tunable optical filter to maintain the output frequency of the receiver output signal at a desired fixed frequency.

In another aspect, a device is described to include an electrical port to receive an input electrical oscillation signal at an input carrier frequency in a radio frequency, microwave, or millimeter wave spectral range; a first laser to produce a first continuous-wave (CW) laser beam at a first laser frequency; an optical modulator to receive the first CW laser beam and the input signal and operable to modulate the first CW laser beam in response to the input signal to produce a modulated optical beam that carries the input signal; a tunable optical filter to filter the modulated optical beam from the optical modulator to select at least one spectral component in the modulated optical signal while rejecting other spectral components and to output a filtered modulated optical beam that carries the at least one selected spectral component; a second laser to produce a second CW laser beam at a second laser frequency; and an optical detector to receive both the filtered modulated optical beam from the tunable optical filter and the second CW laser beam to produce a receiver output signal at an output frequency. In this device, the first and second lasers are phase locked relative to each other. A phase locking unit can be provided in this device to lock the first and second lasers in phase and to control a difference between the first laser frequency and the second laser frequency to tune the output frequency of the receiver output signal. The center frequency of the tunable optical filter can be tuned to the input carrier frequency and this use of the tunable optical filter can be used to achieve a wide tuning range for the device to cover, e.g., one or more spectral ranges in the radio frequency, microwave, and millimeter wave spectra.

In yet another aspect, a method is described to include using an input electrical oscillation signal at an input carrier frequency in a radio frequency, microwave, or millimeter wave spectral range to control optical modulation of a first continuous-wave (CW) laser beam at a first laser frequency from a first laser to produce a modulated optical beam that carries the input electrical oscillation signal; optically filtering the modulated optical beam to select at least one spectral component in the modulated optical signal while rejecting other spectral components to output a filtered modulated optical beam that carries the at least one selected spectral component; mixing the filtered modulated optical beam with a second CW laser beam at a second laser frequency from a second laser which is phase locked relative to the first laser to produce a mixed optical signal; and using an optical detector to convert the mixed optical signal into a receiver output signal at an output frequency.

These and other implementations, features, and associated various advantages are described in greater detail in the drawings, the detailed description, and the claims.

BRIEF DESCRIPTION OF DRAWINGS

FIGS. 11A, 11B and 11C illustrate signal spectra of signals at different processing stages to show the operation of the tunable wideband receiver in the device in FIG. 7 in processing the input signal in FIG. 8.

FIGS. 12A, 12B and 12C illustrate signal spectra of signals at different processing stages to show the operation of the tunable wideband receiver in the device in FIG. 7 in processing the input signal in FIG. 9.

FIGS. 13A, 13B and 13C illustrate signal spectra of signals at different processing stages to show the operation of the tunable wideband receiver in the device in FIG. 7 in processing the input signal in FIG. 10.

DETAILED DESCRIPTION

Figure 1:
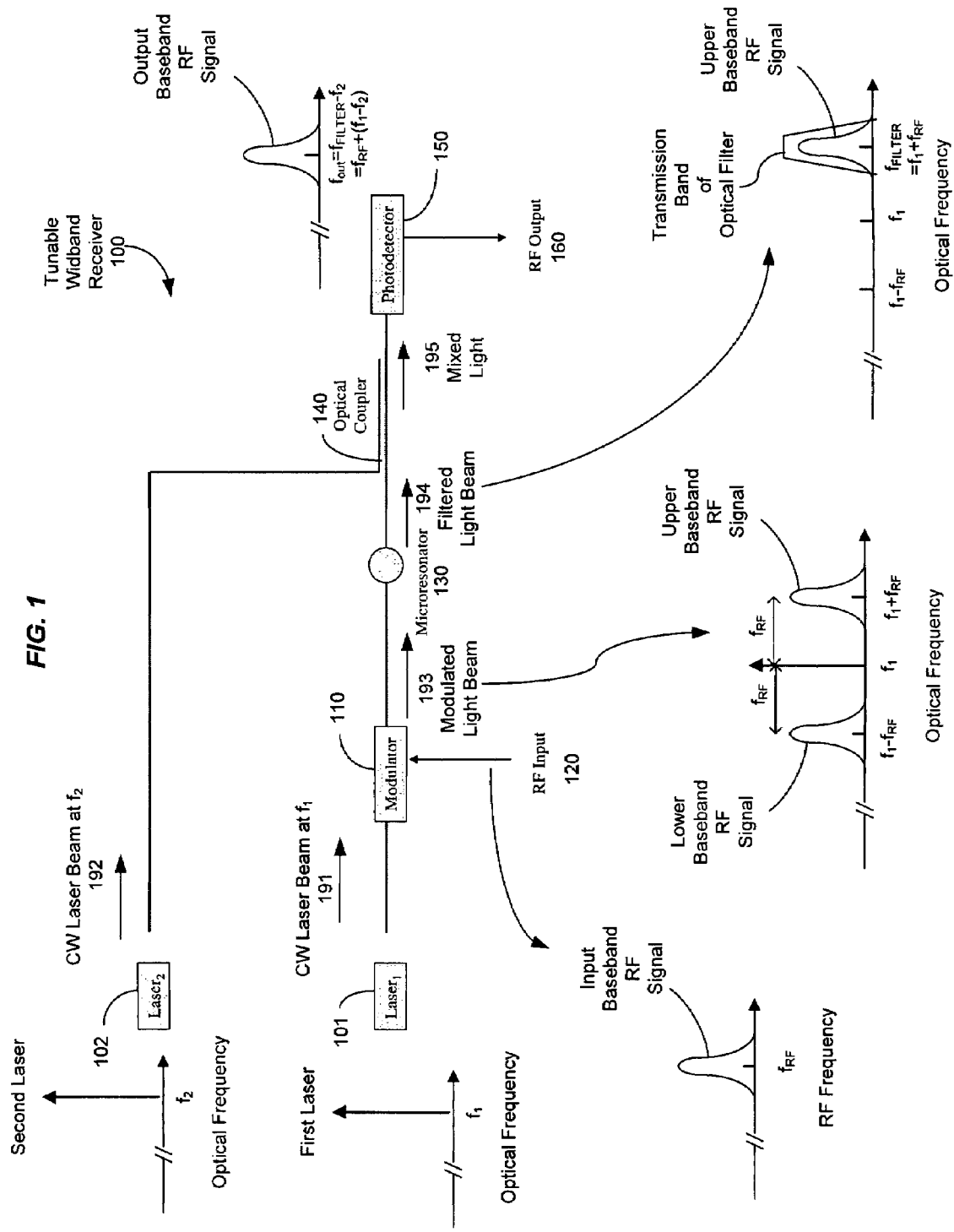
FIG. 1 shows the design and operation of an exemplary tunable wideband receiver for receiving an RF, microwave or millimeter signal based on photonics technology, where two phase-locked lasers are used.

FIG. 1 shows an example of a tunable wideband receiver 100 which includes a first laser 101, a second laser 102, an optical modulator 110, a tunable optical filter 130, an optical coupler 140 and an optical detector 150. An electrical port is provided to receive an input electrical oscillation signal 120 at an input carrier frequency in a radio frequency (RF), microwave, or millimeter wave spectral range. Examples described in this application assume the input signal 120 is an RF signal at an RF carrier frequency $f_{RF}$. The output of the optical detector 150 is the receiver output signal 160. Electronic components, such as amplifiers and filters, may be included in the signal path of the signal 120 or 160. The optical modulator 110 provides the interface between the input electrical signal and the optical part of the receiver 100 and the optical detector 150 provides an interface between the optical part of the receiver 100 and the receiver output signal 160.

The first laser 101, e.g., a diode laser or a solid-state laser, is used to produce a first continuous-wave (CW) laser beam 191 at a first laser frequency f1. The second laser 102, e.g., a diode laser or a solid-state laser, is used to produce a second CW laser beam 192 at a second laser frequency f2. These two laser frequencies f1 and f2 are generally different in most operations and can be close to each other or the same in some operations. At least one of the two lasers 101 and 102 is tunable to allow for a phase locking mechanism to be implemented to lock the lasers 101 and 102 to have a fixed phase relative to each other. The frequency different between the two lasers 101 and 102 can be tuned by tuning the one tunable laser or both tunable lasers to set the carrier frequency of the receiver output signal 160. This use of two phase locked lasers 101 and 102 can achieve up conversion and down conversion of the input carrier frequency $f_{RF}$.

The optical modulator 110 is used to receive the first CW laser beam 191 and the input signal 120 as a modulation control signal. The modulator 110 modulates the first CW laser beam 191 in response to the input signal 120 to produce a modulated optical beam 193 that carries the input signal 120. The modulator 110 can be a phase modulator or an amplitude modulator. An electro-optic phase or amplitude optical modulator, for example, can be used as the modulator 110. Another example of the modulator 110 is a semiconductor optical modulator formed from a multiple quantum well structure that responds to an electrical control signal to perform optical modulation.

Spectra of the input signal 120 and the optical signals 191, 192 and 193 are illustrated by the inserts in FIG. 1. The input signal 120 can be modulated to carry a baseband signal that contains data and is generated by modulating the baseband signal at a predetermined bit rate onto an RF carrier signal at the RF carrier frequency $f_{RF}$. As one example, the modulated optical signal 193 can include upper and lower modulation sidebands at $(f1+f_{RF})$ and $(f1-f_{RF})$, respectively, and the original optical carrier at f1. The sidebands carry the baseband signal in the input signal 120.

The tunable optical filter 130 is placed downstream from the modulator 110 in the optical path of the modulated beam 193. The filter 130 is a bandpass filter with a tunable center frequency $f_{FILTER}$ to selectively transmit one selected spectral segment in the input signal 120, who is carried by the modulated optical beam 193, and to reject all other components. For example, the center frequency $f_{FILTER}$ of the transmission band of the optical filter 130 can be tuned to any desired part of the input signal, e.g., one of the sidebands in the input signal 120, as the selected spectral segment so that the spectral components within the bandwidth of the optical filter 130 can be selected for output in the output signal 160. The bandwidth of the optical filter 130 is designed to be sufficiently broad to cover a desired spectral segment in the input signal 120 as the receiver output 160 and is sufficiently narrow to reject the optical carrier and the other sidebands. Therefore, if the baseband signal of the input signal 120 shown in FIG. 1 is to be selected for the receiver output signal 160, the bandwidth of the filter 130 can be set to be equal to or greater than the bandwidth of the baseband signal in the input signal 120. Therefore, the combination of the optical modulator 110 and the tunable optical filter 130 allows the optical filter 130 to select a spectral segment carried by the input electrical signal 120 in the RF, microwave, or millimeter spectral range in the optical domain. The selected spectral segment can be a portion of a baseband signal carried by an RF, microwave or millimeter carrier in the input signal 120, or an entire baseband signal and its RF, microwave or millimeter carrier of out multiple RF, microwave or millimeter carriers in the input signal 120. The filter 130, therefore, outputs a filtered modulated optical beam 194 that carries the selected spectral component. The tunable optical filter 130 can be in various configurations, such as a microresonator that supports one or more whispering gallery modes, a micro ring resonator, or a Fabry-Perot resonator. Notably, such an optical resonator can be tuned over a wide range in the RF, microwave, and millimeter wave ranges that is difficult to achieve by using electronic filters or electronic filter banks. This tunable optical filter 130 can be tuned over the spectral range of various optical sidebands carried by the modulated signal 193 to select a desired sideband or a portion of a sideband.

Downstream from the optical filter 130 is the optical coupler 140 that is also optically coupled to receive the second CW laser beam 192 from the second laser 102. The optical coupler 140 is designed to combine the beams 192 and 194 together to produce a combined beam 195. The optical detector 150 is used to receive the combined beam 195 and converts the received light into the receiver output signal 160 at an output signal frequency $f_{out}$. The optical detector 150 is a fast photodetector which detects the beat between the two beams 192 and 194. As a result, the frequency of the receiver output signal 160 is $f_{out}=f_{FILTER}-f2$ when $f_{FILTER}>f2$ or $f_{out}=f2-f_{FILTER}$ when $f_{FILTER}<f2$. In the example in FIG. 1, $f_{FILTER}=f_{FR}+f1$ and $f_{out}=f_{RF}+(f1-f2)$.

Notably, the frequencies of the two lasers 101 and 102 can be controlled so that the difference (f1−f2) can be zero, a positive number or a negative number to. When the two lasers 101 and 102 are operated at the same laser frequency (f1=f2), the receiver output signal 160 a filtered version of the input baseband signal. When the two lasers 101 and 102 are operated at the different laser frequencies (f1≠f2), the receiver output signal 160 is a up-converted or down-converted baseband signal with the spectral component selected by the optical filter 130. As such, the difference (f1−f2) can be controlled to place the output frequency $f_{out}$ at any desirable frequency desired in a particular application for the receiver 100. In the example shown in FIG. 1 when the filter 130 is at $f_{FILTER}=f_{FR}+f1$, if the laser frequency f2 of the second laser is set to be higher than the first laser 101, a down conversion can be achieved from DC where $f_{out}=0$ (when the frequency of the laser 102 is higher than the laser 101 by $f_{RF}$) to $f_{out}=f_{RF}$ (when two lasers are at the same frequency). Therefore, the use of the two lasers 101 and 102 provides a flexible and easy implementation of frequency up conversion and down conversion.

In some applications, the receiver 100 can be operated to scan the optical filter 130 through the different spectral components within the baseband signal carried by an RF, microwave or millimeter carrier in the input signal 120 while maintaining the output frequency $f_{out}$ of the receiver output signal 160 at a fixed IF frequency to allow for a processing circuit operated at the fixed IF frequency $f_{out}$ to process the output signal 160 to extract information in the different spectral components in the input signal 120. Referring to FIG. 1, when the first laser 101 is operated at a fixed laser frequency f1, as the optical filter 130 is tuned to change its center frequency $f_{FILTER}$ relative to the laser frequency f1 to scan through different spectral components of the input signal 120 in the optical domain, the frequency f2 of the second laser 102 must be tuned to track and synchronize with the tuning of the filter center frequency $f_{FILTER}$ to maintain $f_{out}=f_{FILTER}-f2$ or $f_{out}=f2-f_{FILTER}$ at the fixed IF frequency. For example, if the IF frequency $f_{out}$ is set to be 500 MHz, then the laser lock will be at an offset corresponding to the center frequency $f_{FILTER}$ of the filter 130 plus 500 MHz. The laser 102 can be locked to be 500 MHz away from the center frequency $f_{FILTER}$ of the filter 130 and maintains this spacing as the filter 130 tunes. This configuration allows generation of the IF signal at the output of the photodetector 150 utilizing the photonic filter 130 and this second LO laser 102.

The above optical processing in the receiver 100 in processing an RF, microwave, or millimeter wave signal avoids use of electronic filters and components that tend to suffer significant signal loss, a limited tuning range and other limitations inherent in the electronic microwave or RF circuit elements. In the receiver 100, both tuning and filtering of an RF, microwave, or millimeter signal are performed optically using optical components in the optical domain.

Figure 2:
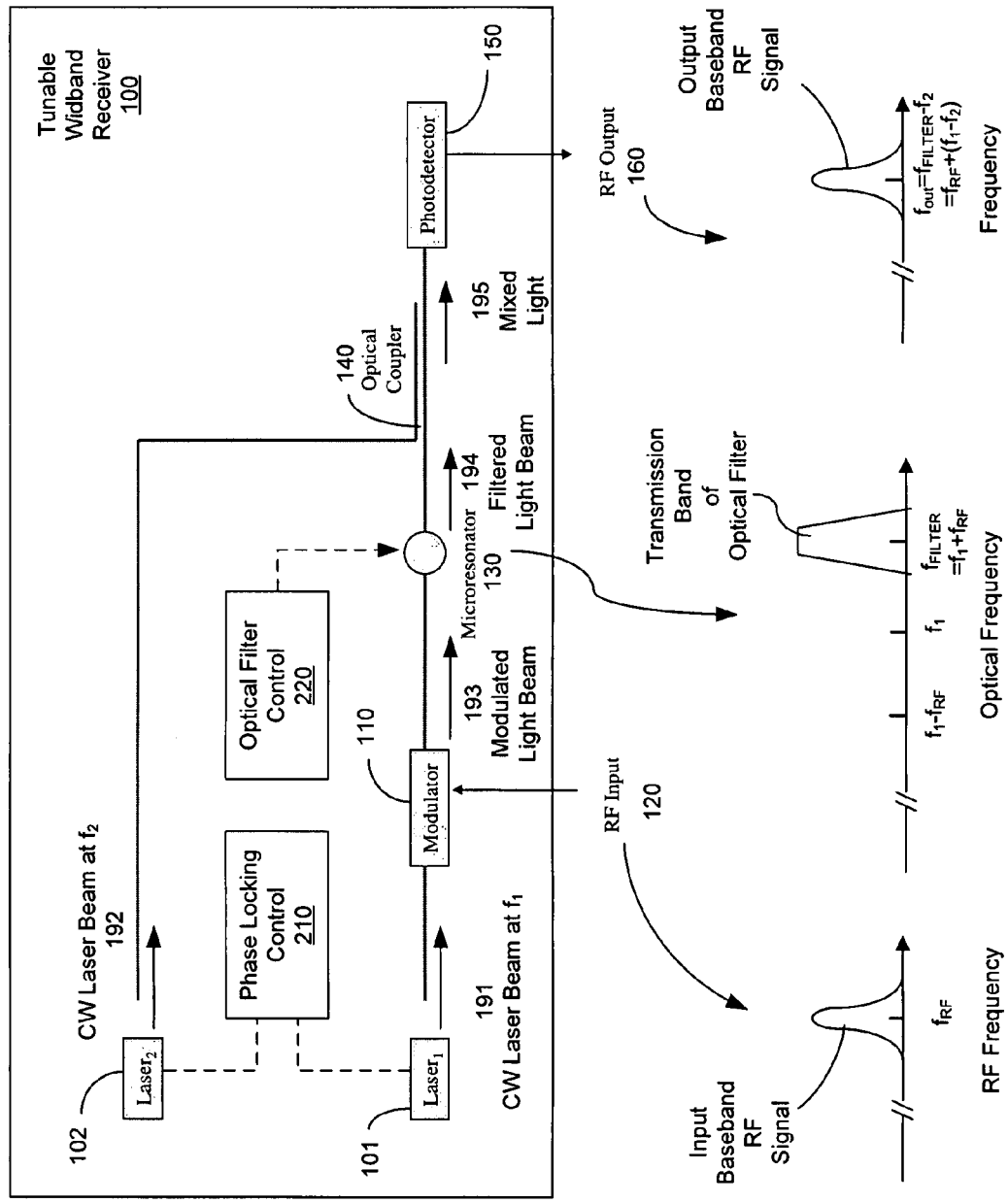
FIG. 2 shows laser tuner, phase locking control and optical filter control in the receiver in FIG. 1.

Referring to FIG. 2, the receiver 100 in FIG. 1 can include a phase locking control module 210 to lock the relative phase between the two lasers 101 and 102 so that the difference in their laser frequencies f1 and f2 is controlled at a fixed value and can be tuned to a different value if needed. At least one laser is a tunable laser to allow for this phase locking control. Hence, one implementation can use one fixed laser (e.g., the laser 101) and one tunable laser (e.g., the laser 102) and another implementation can use two tunable lasers as the lasers 101 and 102. The phase locking control module 210 may be configured to detect a drift in frequency between the two lasers 101 and 102 and tune the tunable laser to negate the drift so that a desired frequency difference (f1−f2) between the two lasers 101 and 102 is maintained. As mentioned above, as the optical filter 130 is tuned relative to the laser frequency f1 from one spectral component to another spectral component in the input signal 120, the laser frequency f2 of the laser 102 is also tuned in synchronization with the filter 130 to maintain a fixed output frequency $f_{out}=f_{FILTER}-f2$ or $f_{out}=f2-f_{FILTER}$. This tuning of the laser 102 to track the optical filter 103 changes the frequency difference (f1−f2) from one desired value to another. The phase locking control module 210 is designed to ensure the frequency difference (f1−f2) is maintained or stabilized at each of these different desired values against any drift or fluctuation between the two lasers 101 and 102.

FIG. 2 also shows an optical filter control 220 for controlling the center frequency of the transmission band of the tunable optical filter 130. A control voltage, for example, may be generated by the control 220 to control and tune the resonance of an electro-optic optical resonator of the optical filter 130 so as to tune the center frequency $f_{FILTER}$ of the transmission band of the filter 130.

Figure 3:
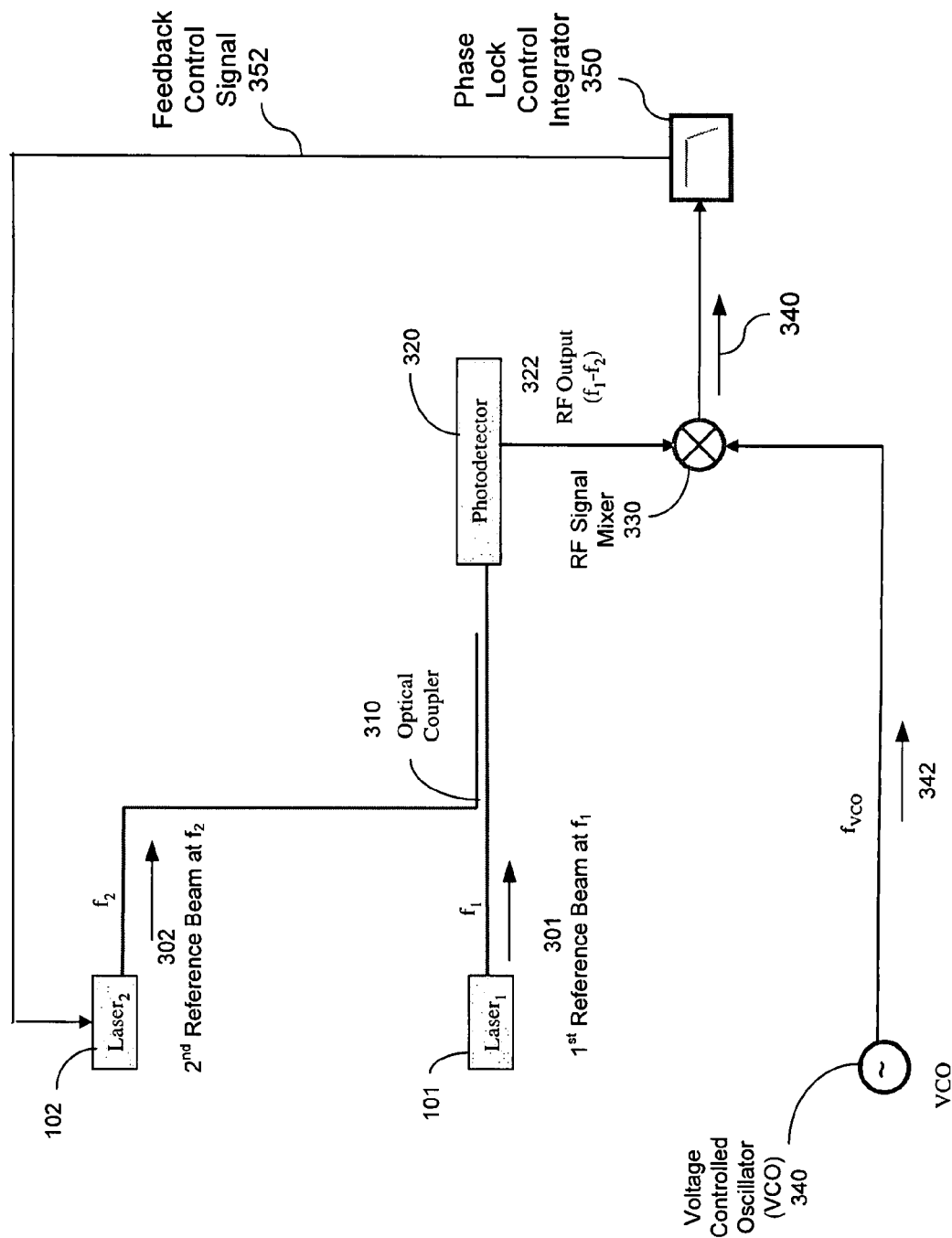
FIG. 3 illustrates one exemplary implementation of the phase locking control in FIG. 2 using a tunable voltage controlled oscillator.

FIG. 3 shows an example of the phase locking control 210 in FIG. 2. In this example, a portion of the laser beam 191 from the laser 101 is split out as a first reference beam 301 for the control 201. Similarly, a portion of the laser beam 192 from the laser 102 is split out as a second reference beam 302 for the control 201. Such beam splitting can be achieved using optical couplers or beam splitters. A beam splitter, for example, can be placed in the optical path of each laser output in FIG. 2 to produce the respective reference beam. A beam coupler 310 can be used to combine the two reference beams 301 and 302 and directs the combined beam to a photodetector 320. The photodetector 320 produces an RF output signal 322 representing the beat between the two reference beams 301 and 302.

In addition, a voltage controlled oscillator 340 is provided in this example for the phase locking control 210 to produce a reference oscillation signal 342 at a reference frequency $f_{vco}$. An electrical signal mixer 330 is coupled to be in communication with the optical detector 320 to receive the detector signal 322 and the voltage controlled oscillator 340 to receive the reference signal 342. The mixer 330 is operable to mix the detector output 322 and the reference oscillation signal 342 to produce an error signal 332 representing a deviation of the difference between the first laser frequency f1 and the second laser frequency f2 from the reference frequency fvco. A control circuit 350 is provided to receive the error signal 332 and, in response to the error signal 332, controls one or both of the first and second lasers 101 and 102 to minimize the deviation so that the difference between the first laser frequency f1 and the second laser frequency f2 approaches the reference frequency fvco. In this example, a control signal 352 is applied to the tunable laser 102 to modify the laser frequency f2 so that the difference (f1−f2) is maintained at the reference frequency fvco. In one implementation, for example, the circuit 350 can be an integrator that integrates the error signal to produce the control signal 352 which controls the laser frequency f2 to nullify the output of the mixer 330 so that fvco=f1−f2 assuming f1 is greater than f2.

Under this phase locking condition, the frequency of the receiver output signal 160 is $$f_{out} = f_{FILTER} - f2 = (f_{FILTER} + fvco) - f1, \text{ or}$$

$$f_{out} = f2 - f_{FILTER} = f1 - (f_{FILTER} + fvco)$$

when f1 is greater than f2; and $$f_{out} = f_{FILTER} - f2 = (f_{FILTER} - fvco) - f1, \text{ or}$$

$$f_{out} = f2 - f_{FILTER} = f1 - (f_{FILTER} - fvco)$$

when f1 is less than f2. Hence, the frequency fvco can be tuned to make (f1−f2) to follow the value of fvco in synchronization with the tuning of the center frequency $f_{FILTER}$ of the optical filter 130. This provides a mechanism to fix the output frequency fout at a desired signal frequency in the signal 160 for subsequent processing.

The tunable optical filter 130 in the receiver 100 may be implemented in various configurations. For example, the tuning may be achieved by thermal control of the resonator whose index, dimension, or both change with temperature, mechanical control of the resonator by changing the dimension of the resonator, electrical control, or optical control. Electro-optic materials may be used to control and tune the resonance frequency of the WGM resonator by an external control signal For example, a single lithium niobate microresonator that supports whispering gallery modes is a tunable optical filter based on the electro-optic effect of the lithium niobate material and can be used as the filter 130.

Figure 4:
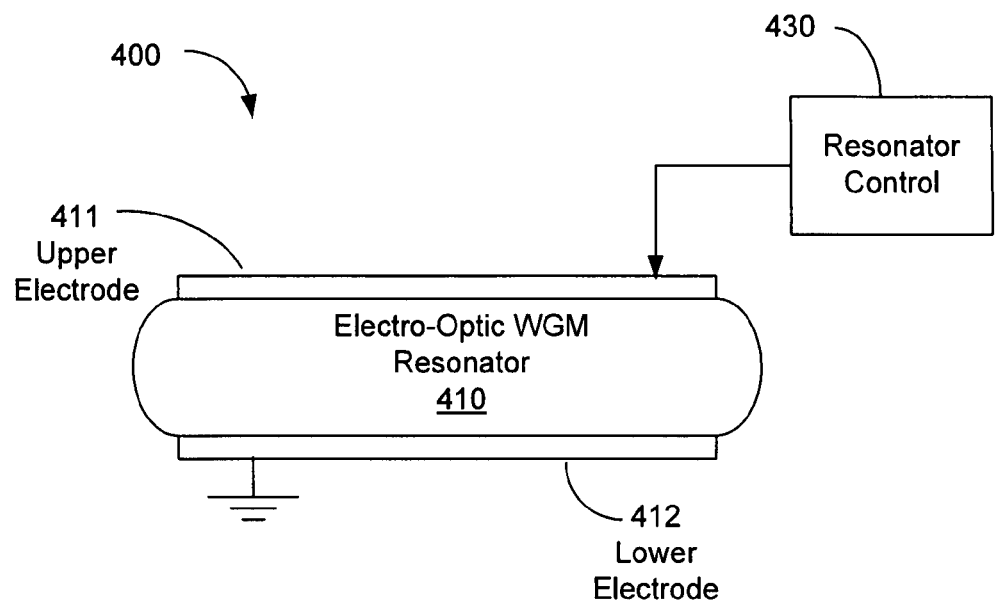
FIG. 4 shows a tunable electro-optic whispering gallery mode microresonator as an exemplary implementation of a tunable optical filter in FIG. 1.

FIG. 4 shows an example of a tunable electro-optic WGM resonator 400 having a WGM resonator 410. The electro-optic material for the entire or part of the resonator 410 may be any suitable material, including an electro-optic crystal such as Lithium Niobate and semiconductor multiple quantum well structures. One or more electrodes 411 and 412 may be formed on the resonator 410 to apply a control electrical field in at least the region where the WG modes are present to control the index of the electro-optical material and to change the filter function of the resonator. Assuming the resonator 410 has disk or ring geometry, the electrode 411 may be formed on the top of the resonator 410 and the electrode 412 may be formed on the bottom of the resonator 410. In implementation, the electrodes 411 and 212 may be in various geometries to apply a control voltage to tune the resonator. For example, the electrodes 211 and 412 may be microstrip line electrodes. A tuning control unit 430 such as a control circuit may be used to supply the electrical control signal to the electrodes 411 and 412. The control voltage may be a DC voltage to set the resonance peak of the resonator 400 at a desired spectral location. The DC voltage may be adjusted by the control unit 430 to tune the spectral position of the transmission peak when such tuning is needed. For dynamic tuning operations, the control unit 430 adjusts the control voltage in response to a control signal to, e.g., maintain the transmission peak at a desired spectral position or frequency or to change the frequency of the transmission peak to a target position.

For example, a Z-cut LiNbO$_3$ disk cavity with a diameter of d=4.8 mm and a thickness of 170 μm may be used as the resonator 210. The cavity perimeter edge may be prepared in the toroidal shape with a 100 μm radius of curvature. As an alternative to the strip electrodes shown in FIG. 4, the top and bottom surfaces of the disk resonator may be coated with conductive layers for receiving the external electrical control signal. A metal such as indium may be used to form the conductive coatings. Tuning is achieved by applying and adjusting a voltage to the top and bottom conductive coatings. Each conductive coating may be absent on the central part of the resonator and are present at the perimeter edge of the resonator where WGMs are localized.

Such a single-resonator filter has a Lorentzian lineshape in its spectral transmission and presents a less than ideal passband with a relatively slow roll-off from the center transmission peak. When the signal spectral bands in the input signal 101 are close to one another, the single-resonator filter may not be sufficient to separate neighboring bands. In various implementations, two or more such tunable microresonators may be optically cascaded together in series to create a multi-pole optical filter with a flatter passband and sharper spectral roll-offs. Light can be evanescently coupled between the closely-spaced (e.g., about 1 μm) or directly contacted microresonators.

The shape of the passband function for such a cascaded multi-resonator filter may be controlled by adjusting a number of device parameters. For example, the number of microresonators sets the order of the filter and directly determines how sharply the filter response rolls-off outside the passband. The quality factors of microresonators can determine the natural linewidth of the filter function. Tunable lithium niobate microresonators may be fabricated to produce varying bandwidths, such as narrow linewidths of about 10 MHz or less, or broad linewidths at tens of MHz. The physical gaps that separate the cascaded microresonators (and the coupling prisms at either end of the series from the first and last microresonators) can be adjusted to control the coupling strengths. The gaps may be fixed in certain implementations and adjustable for maximum flexibility in dynamically reconfiguring the filter function in other implementations. Different control voltages to different microresonators may be used to provide desired offsets of the different filter poles relative to a selected center of the filter passband to achieve a desired filter spectral profile. The tuning control unit 144 may include an embedded logic unit that dynamically adjusts the offsets of the filter poles. Accurate placements of the poles can minimize ripple in the final filter passband.

The design of multi-pole optical filters with microresonators may be analogous to design multi-pole RF filters to a certain extent but the design parameters are very different. For example, the equivalent RF Q factors of microresonators are much higher than many RF filters. The equivalent RF Q factor a Microresonator is the optical Q factor multiplied by a ration of the RF frequency over the optical frequency. Hence, at the optical wavelength of 1550 nm, the ratio is about $5 \times 10^{-5}$ and an optical Q factor of $10^9$ is equivalent to an RF Q factor of about $5 \times 10^4$.

Figure 5:
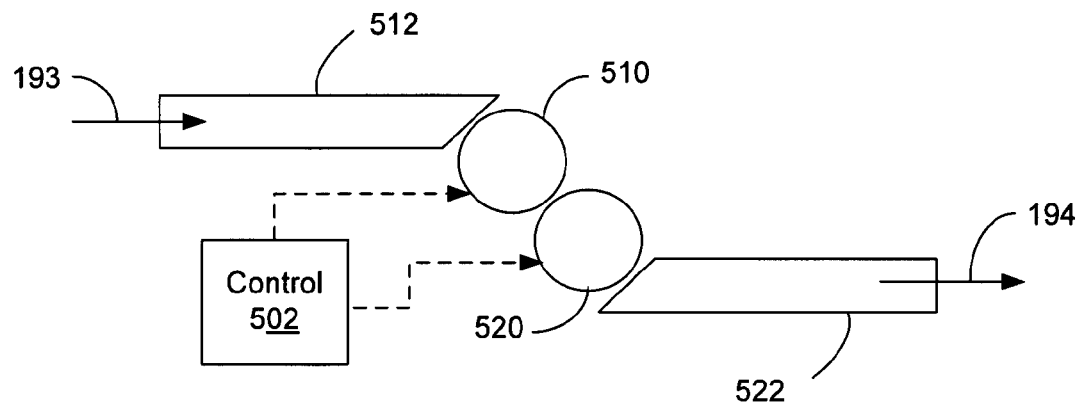
FIG. 5 shows a two-pole tunable optical filter with two coupled whispering gallery mode microresonators, another exemplary implementation of a tunable optical filter in FIG. 1.

FIG. 5 shows an exemplary tunable two-resonator filter having two cascaded WGM resonators 510 and 520. In some implementations, both resonators may have approximately the same diameter or dimension to have similar quality factors. In certain other implementations, it may be advantageous to use different resonators 510 and 520 with different geometries or physical dimension to use their difference in the spectral profile to produce the desired composite filter function. The resonators 510 and 520 are placed close to or in contact with each other to allow for direct optical coupling under proper resonance conditions. Alternatively, an optical coupling mechanism may be placed between the resonators 510 and 520 to assist and facilitate the inter-resonator optical coupling. An input optical coupler 512 is placed near or in contact with the first resonator 510 to couple an input optical signal 531 into the first resonator 510 of the filter. An output optical coupler 522 is placed near or in contact with the second resonator 520 to couple optical energy inside the second resonator 520 out to produce an output optical signal 532 as the transmission of the filter. A control unit 502 is provided to control and tune at least one of the resonators 510 and 520 to make the filter tunable. In some implementations, both resonators 510 and 520 may be tunable.

Figure 6:
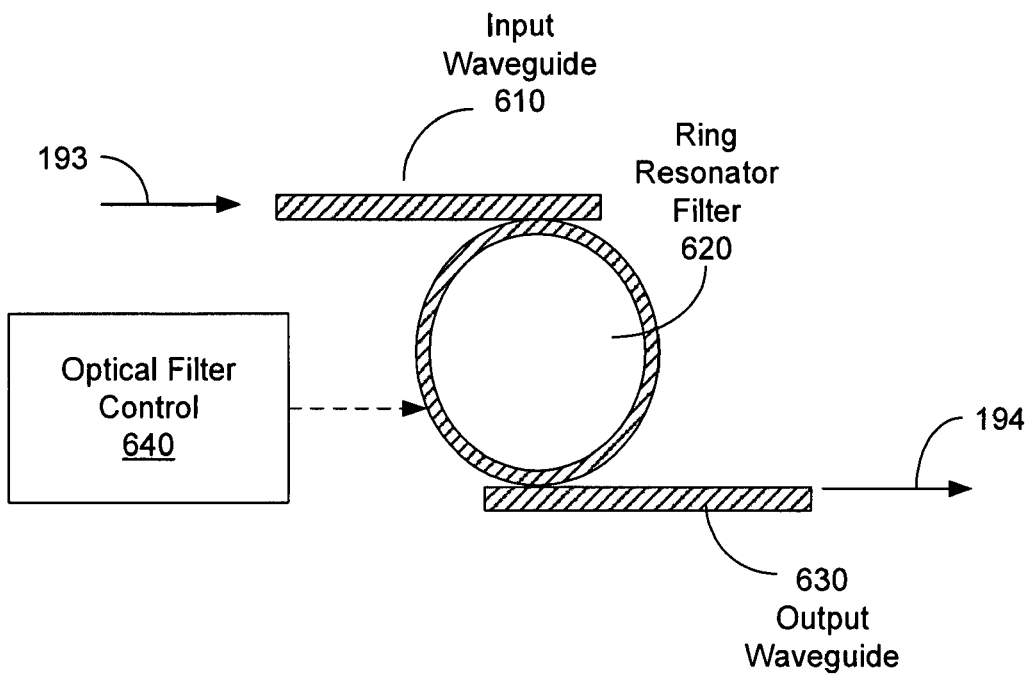
FIG. 6 shows an optical ring resonator filter as an exemplary implementation of a tunable optical filter in FIG. 1.

FIG. 6 shows an example of a ring resonator as the optical filter 130 in FIGS. 1 and 2. A closed optical ring 620 is used as the filter which can be formed in a ring waveguide or a fiber loop. A resonator control 640 can apply a control signal to change the resonance of the ring 620 via electro-optic effect or other effects. An input waveguide 610 and an output waveguide 630 can be used to direct the input light 193 and the output light 194, respectively. The waveguides 610 and 630 can be fibers. The coupling between each waveguide and the ring 620 can be evanescent coupling.

Figure 7:
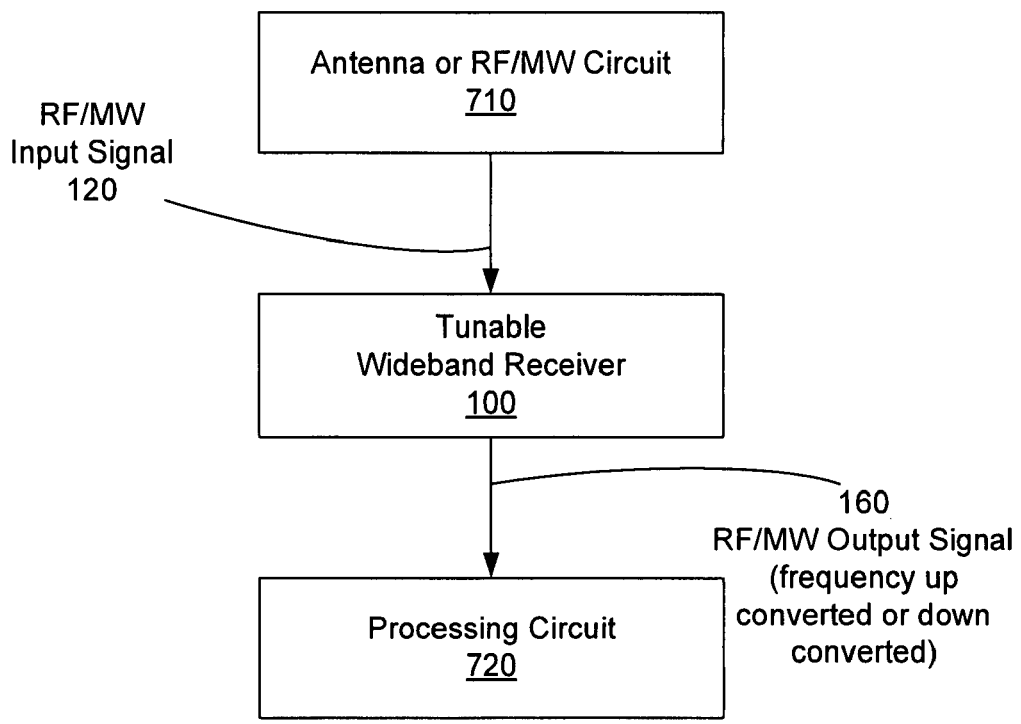
FIG. 7 shows an example of an electronic device that uses the tunable wideband receiver in FIG. 1.

FIG. 7 shows an example of an RF device based on the receiver 100. An antenna or circuit 710 is provided to direct an RF signal 120 to the receiver 100. The receiver 100 processes the signal 120 to produce a receiver output signal 160 that is either up converted or down converted in frequency to a desired carrier frequency suitable for processing by a processing circuit 720. This design can be used in a wide range of communication devices for wired and wireless communications.

Figure 8:
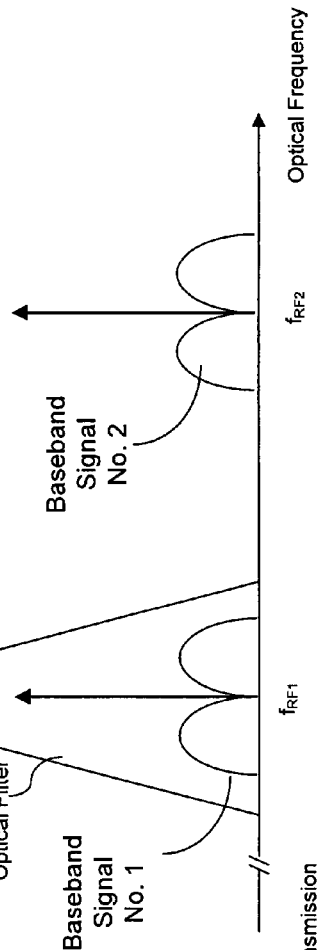
FIGS. 8, 9 and 10 illustrate three examples of an input RF signal that can be processed by the device in FIG. 7.
Figure 9:
Figure 10:
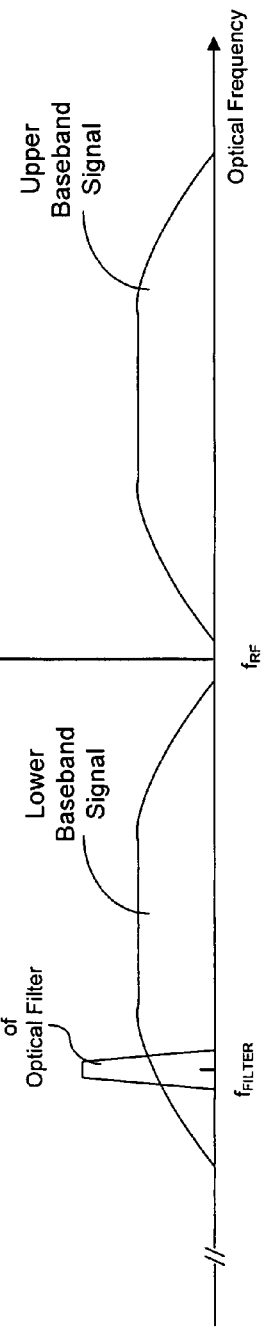

FIGS. 8, 9 and 10 illustrate three examples of an input RF signal that can be processed by the device in FIG. 7. FIG. 8 show the spectrum of the input signal 120 with two or more RF carriers (e.g., fRF1 and fRF2) that carry different signal baseband signals (e.g., No. 1 and No. 2). The upper and lower sidebands of each baseband signal are close to its RF carrier. The optical filter 130 can be designed to have a bandwidth that covers a spectral segment that includes the RF carrier at fRF1 and the upper and lower bands for the baseband signal No. 1. The baseband signal No. 2 and its carrier at fRF2 are rejected by the optical filter 130. FIG. 9 shows the spectrum of the input signal 120 with a single RF carrier that carries a baseband signal with upper and lower sidebands sufficiently far from the RF carrier to allow the optical filter 130 to select only one sideband of the baseband signal, e.g., the lower sideband, for processing by the circuit 720. FIG. 10 shows the spectrum of the input signal 120 with a single RF carrier that carries a baseband signal with upper and lower sidebands with a wide spectral range for an application where the optical filter can be used to select only one segment in the upper or lower sideband of the baseband signal for processing by the circuit 720.

FIGS. 11A, 11B and 11C illustrate signal spectra of signals at different processing stages to show the operation of the tunable wideband receiver in the device in FIG. 7 in processing the input signal in FIG. 8. The optical modulator 110 modulates the laser beam 191 at the optical carrier f1 to convert the input signal 120 from the RF domain into the optical domain in order for the optical filter 130 to filter the RF signal 120 (FIG. 11A). Next, the optical filter 130 is tuned to fRF1 to select the first baseband signal No. 1 carried by the RF carrier fRF1 while rejecting all other spectral components in signal 120 and the optical carrier at f1. FIG. 11B shows the spectrum of the filtered beam 194 and the second laser 102. FIG. 11C shows the spectrum of the frequency-converted receiver output signal 160 carrying only the first baseband signal No. 1 and its RF carrier at fRF1. The two lasers 101 and 102 can be controlled to adjust (f1−f2) to place the output frequency fout at any desired frequency.

FIGS. 12A, 12B and 12C illustrate signal spectra of signals at different processing stages to show the operation of the tunable wideband receiver in the device in FIG. 7 in processing the input signal in FIG. 9. FIG. 12A shows the spectrum of the modulated optical signal 193 output by the optical modulator 110. The optical filter 130 is tuned to the upper side of the optical carrier f1 to select the lower baseband signal in the input signal 120 while rejecting its carrier at (f1+fRF), other sidebands and the optical carrier at f1 (FIG. 12B). The laser 102 is used to beat with the filtered optical signal 194 to produce the receiver output signal in FIG. 12C. The two lasers 101 and 102 can be controlled to adjust (f1−f2) to place the output frequency fout at any desired frequency.

In some applications, the baseband signal in FIG. 10 can be a composite signal that contains different baseband signals transmitted by different wireless signal transmitters at the same RF carrier frequency. The device in FIG. 7 can be a wireless receiver with an antenna or antenna array 710 that receives such different signals that appear as the signal 120 shown in FIG. 10 at the output of the antenna 710. A particular baseband signal from a particular transmitter is buried or hidden in the received composite baseband signal in FIG. 10. For example, a baseband signal shown in FIG. 9 can be buried in the signal in FIG. 10. In this situation, the device in FIG. 7 can be designed to use the tunable optical filter 130 to scan through the composite baseband signal in FIG. 10 to sample a particular baseband segment or different baseband segments and use the processing circuit 720 to extract a particular baseband signal or multiple baseband signals that are hidden in the composite baseband signal.

FIGS. 13A, 13B and 13C illustrate the operation of the device in FIG. 7 in processing the composite baseband signal in FIG. 10. FIG. 13A shows the spectrum of the modulated optical signal 193 and the spectral position of the tunable optical filter 130 in one measurement. In this measurement, the optical filter 130 is tuned to a segment in the lower branch of the received baseband signal below the RF carrier at fRF. FIG. 13B shows the spectrum of the filtered optical signal 194 and the laser 102. FIG. 13C shows the spectrum of the output signal 160.

The two lasers 101 and 102 can be controlled to adjust (f1−f2) to place the output frequency fout at any desired frequency. For example, the output frequency fout can be fixed at 1 GHz and the processing circuit 720 of the device in FIG. 7 is designed to process at 1 GHz. The optical filter 130 is tuned sequentially, one segment at a time, to scan over the entire lower branch of the baseband signal to obtain sampled signals for different segments at the same signal frequency of 1 GHz. The processing circuit 720 process the sampled signals to extract data from all segments in the lower branch of the received baseband signal to recover data in each baseband signal buried in the received baseband signal.

Figure 14:
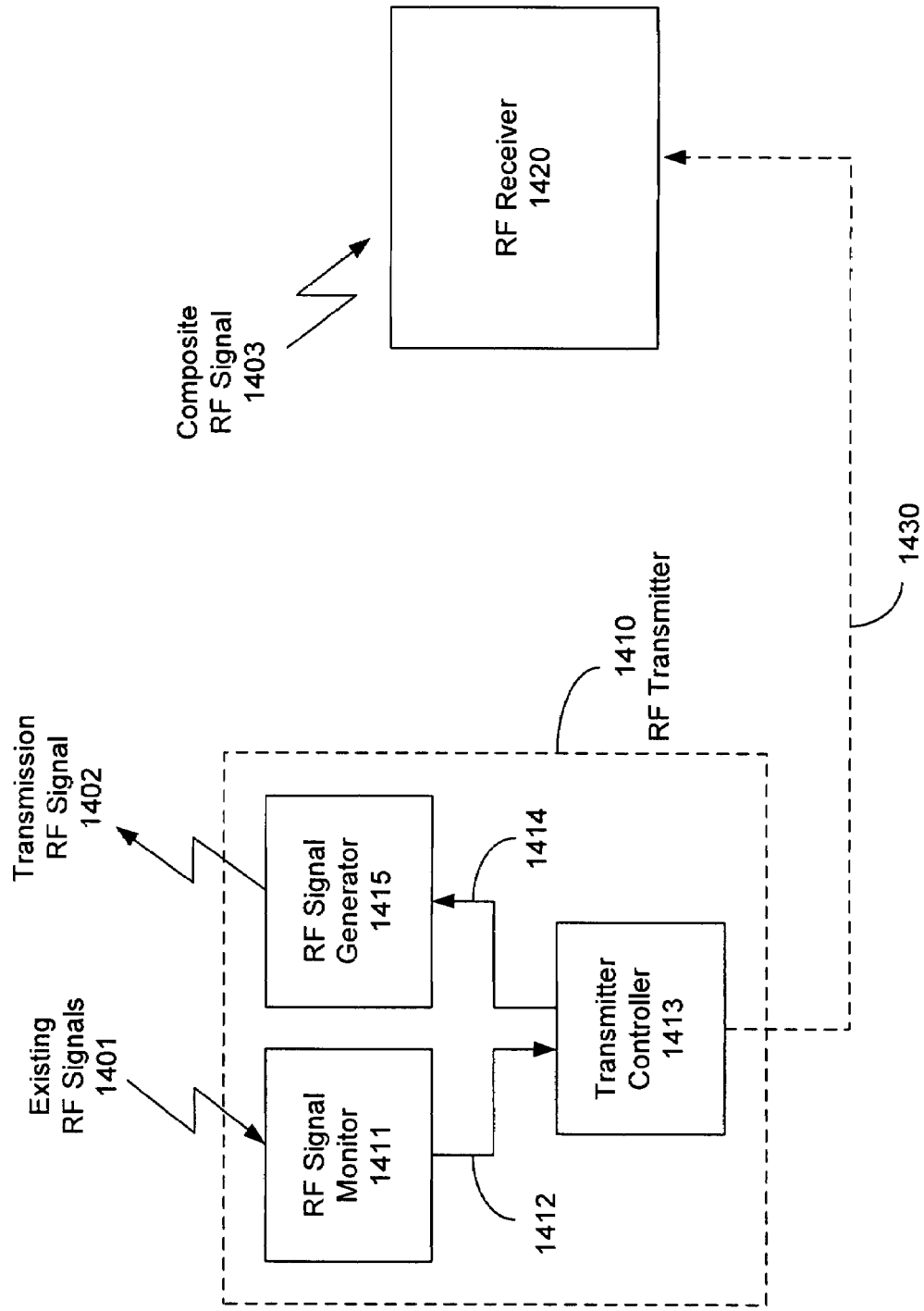
FIG. 14 illustrates an example of a secured communication system based on a tunable wideband receiver using photonic technology.

The above described tunable wideband receiver designs and detection techniques can be used to construct a secured communication system. FIG. 14 illustrates an example of a secured communication system. This system includes a wireless RF transmitter 1410 and a wireless RF receiver 1420. The transmitter 1410 includes an RF signal monitor 1411 to receive existing RF signals 1401 in the air generated by other sources outside the system of the transmitter 1410 and the receiver 1420 and analyzes the spectral components in the RF signals 1401. A transmitter controller 1413 is provided in the transmitter 1410 to receive the spectral information 1412 of the existing signals 1401 from the RF signal monitor 1411. The existing signals 1401 may include, among other spectral components, an RF signal as shown in FIG. 10. The transmitter controller 1413 generates a transmission control signal 1414 to an RF generator 1415 which produces an RF transmission signal 1402. The RF receiver 1420 in this system receives a composite RF signal 1403 which includes the RF transmission signal 1402 and other RF signals including the RF signals 1401.

The security in this system can be implemented in the generation of the RF transmission signal 1402. In this regard, the transmitter controller 1413 uses the spectral information 1412 of the existing signals 1401 from the RF signal monitor 1411 to select a frequency band offset from the RF carrier of the composite baseband signal shown in FIG. 10 to create a transmission signal profile with a spectrum shown in FIG. 9 where the upper and lower sidebands in FIG. 9 are within the selected frequency band selected by the transmitter controller 1413. The transmitter controller 1413 commends the RF signal generator 1415 to generate the RF transmission signal 1403 based the transmission signal profile. This signal 1402 has the same RF carrier with the existing signals 1401 and blends with existing signals 1401. It can be difficult to separate the signal 1402 from other signals with the same RF carrier without detailed information on the spectral properties of the signal 1402.

The receiver 1420 receives the signal 1403 with a spectrum similar to that in FIG. 10 in which the signal 1402 with a spectrum similar to that in FIG. 9 is buried. The receiver 1420 can be implemented, for example, with a structure shown in FIG. 7. The optical filter 130 in the tunable wideband receiver 100 is tuned to the selected frequency band set by the transmitter controller 1413 to extract the hidden signal. The selected frequency band set by the transmitter controller 1413 may be varied by the transmitter controller 1413 and this information is transmitted through a communication channel 1430 to the receiver 1420 so that the optical filter 1430 can be tuned to the proper selected frequency band when a change to the selected frequency band is made. The transmitter controller 1413 may also control the RF signal generator 1415 to generate a modified version of the composite signal spectrum of the existing RF signals 1401 in which the existing RF signals 1401 are replicated and the true signal in FIG. 9 with same RF carrier is mixed with the replica with the existing signals 1401 to produce the RF transmission signal 1402. The receiver 1420, with the knowledge of the selected frequency band set by the transmitter controller 1413, uses the tunable optical filter 130 to extract the true signal sent out by the RF transmitter 1410.

While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, it is understood that variations and enhancements may be made.

What is claimed is:

1. A device, comprising:
    an electrical port to receive an input electrical oscillation signal at an input carrier frequency in a radio frequency, microwave, or millimeter wave spectral range;
    a first laser to produce a first continuous-wave (CW) laser beam at a first laser frequency;
    an optical modulator to receive the first CW laser beam and the input signal and operable to modulate the first CW laser beam in response to the input signal to produce a modulated optical beam that carries the input signal;
    a tunable optical filter to filter the modulated optical beam from the optical modulator to select at least one spectral component in the modulated optical signal while rejecting light at the first laser frequency and other spectral components and to output a filtered modulated optical beam that carries the at least one selected spectral component;
    a second laser to produce a second CW laser beam at a second laser frequency, the first and second lasers are phase locked relative to each other; and
    an optical detector to receive both the filtered modulated optical beam from the tunable optical filter and the second CW laser beam to produce a receiver output signal at an output frequency.

2. The device as in claim 1, comprising:
    a phase locking unit that locks the first and second lasers in phase and controls a difference between the first laser frequency and the second laser frequency to tune the output frequency of the receiver output signal.

3. The device as in claim 2, wherein:
    the phase locking unit controls the first and second laser frequencies so that the output frequency is at or near zero.

4. The device as in claim 2, wherein:
    the phase locking unit controls the difference between the first laser frequency and the second laser frequency to make the output frequency higher than the input carrier frequency of the input electrical oscillation signal.

5. The device as in claim 2, wherein:
    the phase locking unit controls the difference between the first laser frequency and the second laser frequency to make the output frequency lower than the input carrier frequency of the input electrical oscillation signal.

6. The device as in claim 2, wherein:
    the phase locking control unit comprises:
        an optical detector that receives a portion of the first CW laser beam and a portion of the second CW laser beam to produce a detector output;
        a voltage controlled oscillator to produce a reference oscillation signal at a reference frequency;
        an electrical signal mixer in communication with the optical detector and the voltage controlled oscillator and operable to mix the detector output and the reference oscillation signal to produce an error signal representing a deviation of the difference between the first laser frequency and the second laser frequency from the reference frequency; and
        a control circuit that receives the error signal and, in response to the error signal, controls one of the first and second lasers to minimize the deviation so that the difference between the first laser frequency and the second laser frequency approaches the reference frequency.

7. The device as in claim 6, wherein:
the voltage controlled oscillator tunes the reference frequency to tune the output frequency of the receiver output signal.

8. The device as in claim 1, wherein:
the tunable optical filter comprises a tunable whispering gallery mode resonator.

9. The device as in claim 8, wherein:
the tunable whispering gallery mode resonator exhibits an electro-optical effect.

10. The device as in claim 1, wherein:
the tunable optical filter comprises a tunable optical ring resonator.

11. The device as in claim 1, wherein:
the tunable optical filter comprises two optical resonators that are optically coupled to produce a filter function of at least a second order.

12. The device as in claim 11, wherein:
at least one of the two optical resonators exhibits an electro-optic effect.

13. The device as in claim 1, wherein:
the tunable optical filter comprises a lithium niobate optical resonator that is tuned via an electro-optic effect.

14. The device as in claim 1, wherein:
the optical modulator is an optical phase modulator.

15. The device as in claim 1, wherein:
the optical modulator is an optical amplitude modulator.

16. The device as in claim 1, wherein:
the input electrical oscillation signal carries a baseband signal, and
the tunable optical filter has a filter bandwidth less than a bandwidth of the baseband signal to select a portion of the baseband signal carried by the receiver output signal.

17. A method, comprising:
using an input electrical oscillation signal at an input carrier frequency in a radio frequency, microwave, or millimeter wave spectral range to control optical modulation of a first continuous-wave (CW) laser beam at a first laser frequency from a first laser to produce a modulated optical beam that carries the input electrical oscillation signal;
optically filtering the modulated optical beam to select at least one spectral component in the modulated optical signal while rejecting light at the first laser frequency other spectral components to output a filtered modulated optical beam that carries the at least one selected spectral component;
mixing the filtered modulated optical beam with a second CW laser beam at a second laser frequency from a second laser, which is phase locked relative to the first laser, to produce a mixed optical signal; and
using an optical detector to convert the mixed optical signal into a receiver output signal at an output frequency that carries the least one selected spectral component.

18. The method as in claim 17, comprising:
tuning a difference between the first laser frequency and the second laser frequency to tune the output frequency.

19. The method as in claim 17, comprising:
controlling the first and second laser frequencies to set the output frequency at or near zero.

20. The method as in claim 17, comprising:
controlling a difference between the first laser frequency and the second laser frequency to make the output frequency higher than the input carrier frequency of the input electrical oscillation signal.

21. The method as in claim 17, comprising:
controlling a difference between the first laser frequency and the second laser frequency to make the output frequency lower than the input carrier frequency of the input electrical oscillation signal.

22. The method as in claim 17, comprising:
using a tunable optical filter to optically filtering the modulated optical beam;
tuning a center frequency of the tunable optical filter to tune the at least one selected spectral component; and
controlling the first and the second lasers to tune a difference between the first and the second laser frequencies in response to the tuning of the center frequency of the tunable optical filter to maintain the output frequency of the receiver output signal at a desired fixed frequency.

23. The method as in claim 17, comprising:
producing a first RF signal that uses a first RF carrier to carry a first baseband signal;
mixing the first RF signal with a second RF signal that uses the first RF carrier to carry a second baseband signal to produce the input electrical oscillation signal, wherein the first baseband signal has a bandwidth less than the second baseband signal and is located in middle of the second baseband signal in frequency, and
wherein the at least one selected spectral component is in the first baseband signal.

24. A device, comprising:
a first laser to produce a first continuous-wave (CW) laser beam at a first laser frequency;
an optical modulator to receive the first CW laser beam and the input signal and operable to modulate the first CW laser beam in response to an electrical oscillation signal to produce a modulated optical beam that carries the electrical oscillation signal;
a tunable optical filter to filter the modulated optical beam from the optical modulator to select at least one spectral component in the modulated optical signal while rejecting light at the first laser frequency and other spectral components and to output a filtered modulated optical beam that carries the at least one selected spectral component;
a filter control unit to tune a center frequency of the tunable optical filter to tune the at least one selected spectral component;
a second laser to produce a second CW laser beam at a second laser frequency;
an optical detector to receive both the filtered modulated optical beam from the tunable optical filter and the second CW laser beam to produce a receiver output signal at an output frequency; and
a control unit to lock the first and second lasers in phase relative to each other and to control the first and the second lasers to tune a difference between the first and the second laser frequencies in response to the tuning of the center frequency of the tunable optical filter to maintain the output frequency of the receiver output signal at a desired fixed frequency.

25. The device as in claim 24, wherein:
the tunable optical filter comprises a tunable whispering gallery mode resonator which exhibits an electro-optical effect.

* * * * *